(12) United States Patent
Pedretti et al.

(10) Patent No.: US 12,682,951 B2
(45) Date of Patent: Jul. 14, 2026

(54) DYNAMIC ANALOG CONTENT ADDRESSABLE MEMORY

(71) Applicant: Hewlett Packard Enterprise Development LP, Spring, TX (US)

(72) Inventors: Giacomo Pedretti, San Francisco, CA (US); Luca Buonanno, Milpitas, CA (US); James Ignowski, Fort Collins, CO (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 246 days.

(21) Appl. No.: 18/598,873

(22) Filed: Mar. 7, 2024

(65) Prior Publication Data

US 2025/0285678 A1     Sep. 11, 2025

(51) Int. Cl.
*G11C 15/04* (2006.01)
*G11C 11/408* (2006.01)
*G11C 11/4096* (2006.01)

(52) U.S. Cl.
CPC .......... *G11C 15/04* (2013.01); *G11C 11/4085* (2013.01); *G11C 11/4096* (2013.01)

(58) Field of Classification Search
CPC .. G11C 15/04; G11C 15/4085; G11C 15/4096
USPC ....................................................... 365/49.1
See application file for complete search history.

(56) References Cited

U.S. PATENT DOCUMENTS

| | | | | |
|---|---|---|---|---|
| 8,031,502 B2* | 10/2011 | Kim | ....................... | G11C 15/04 |
| | | | | 365/49.1 |
| 2025/0336441 A1* | 10/2025 | Zhao | .................... | G11C 27/005 |

OTHER PUBLICATIONS

Kohda et al., "Unassisted True Analog Neural Network Training Chip," IEEE International Electron Devices Meeting (IEDM), Dec. 12-18, 2020, 4 pages.

* cited by examiner

*Primary Examiner* — Connie C Yoha
(74) *Attorney, Agent, or Firm* — Slater Matsil, LLP

(57) ABSTRACT

A dynamic analog content addressable memory (CAM) cell uses volatile memory to store a range. The dynamic analog CAM cell includes an upper bound circuit and a lower bound circuit. The upper bound circuit includes a first pull-down transistor and a first controlled current generator. The first controlled current generator is configured to store an upper bound of the range in a first dynamic memory circuit, and to activate the first pull-down transistor when an analog input value is greater than the upper bound of the range. The lower bound circuit includes a second pull-down transistor and a second controlled current generator. The second controlled current generator is configured to store a lower bound of the range in a second dynamic memory circuit, and to activate the second pull-down transistor when the analog input value is less than the lower bound of the range.

9 Claims, 6 Drawing Sheets

100

200

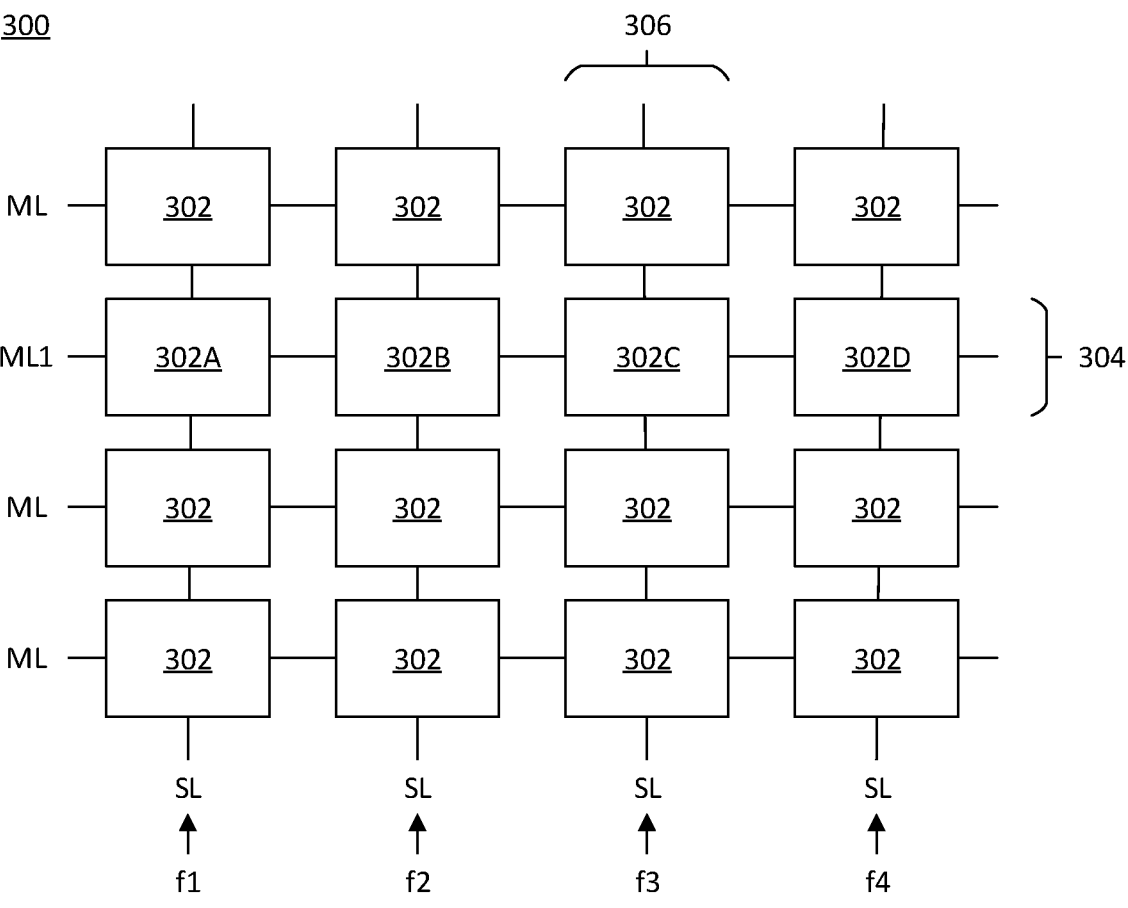
Figure 3
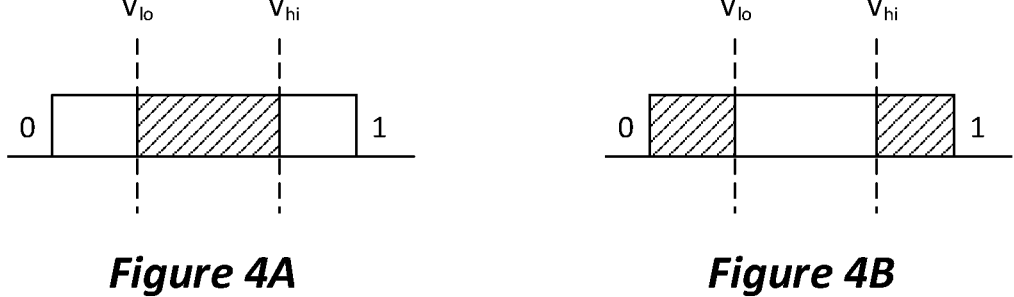
Figure 4A        Figure 4B

<u>800</u>

DYNAMIC ANALOG CONTENT ADDRESSABLE MEMORY

BACKGROUND

Content addressable memory (CAM) is a type of computing memory in which stored data is not accessed by its location, but rather by its content. A search word is input to a CAM array, and the CAM array searches for the word in its contents; when a value of the search word is matched by the stored data, the CAM array returns the location where the found contents reside. CAMs are powerful, efficient, and fast.

BRIEF DESCRIPTION OF THE DRAWINGS

Aspects of the present disclosure are best understood from the following detailed description when read with the accompanying figures.

FIG. 3 is a schematic of a dynamic analog CAM array, according to some implementations.

FIGS. 4A-4B show examples of ranges that may be stored in dynamic analog CAM cells.

Corresponding numerals and symbols in the different figures generally refer to corresponding parts unless otherwise indicated. The figures are drawn to clearly illustrate the relevant aspects of the disclosure and are not necessarily drawn to scale.

DESCRIPTION

The following disclosure provides many different examples for implementing different features. Specific examples of components and arrangements are described below to simplify the present disclosure. These are, of course, merely examples and are not intended to be limiting.

An analog content addressable memory (CAM) cell stores a range of analog values (which may be referred to as a "variance range" or simply a "range"). As used herein, a stored range refers to a range of voltages that is stored in an analog CAM cell, where the range of voltages is defined by an upper bound and a lower bound. The lower bound and the upper bound of a stored range may be programmed for an analog CAM cell. Components of an analog CAM cell are programmed with values that represent the lower bound and the upper bound of a desired range. An analog test value may be input to an analog CAM cell, and the output of the analog CAM cell indicates whether the test value is inside/outside of the stored range. Depending on the configuration of an analog CAM cell, it may indicate a match when the test value falls inside of its stored range or when the test value falls outside of its stored range.

One type of component for implementing an analog CAM cell is nonvolatile memory, such as programmable resistors, which may be programmed with a desired range. Examples of programmable resistors include memristors, magnetoresistive memory, ferroelectric memory, and the like. However, the manufacturing of programmable resistors is difficult to scale down to advanced technology nodes (e.g., less than 7 nm). Additionally, reprogramming of some types of programmable resistors is slow.

The present disclosure describes an analog CAM cell that uses volatile memory to store a range. Specifically, the lower bound and the upper bound of a range are each stored in dynamic memory of an analog CAM cell. Such an analog CAM cell may be referred to as a "dynamic analog CAM cell." Dynamic memory may be fabricated using a CMOS process. The manufacturing of dynamic memory is easier to scale down to advanced technology nodes than the manufacturing of programmable resistors, and thus the dynamic analog CAM cells may be formed to a higher density. Additionally, dynamic memory may be reprogrammed faster than programmable resistors, which may be particularly advantageous for some applications, such as machine learning.

An array of dynamic analog CAM cells may be referred to as a "dynamic analog CAM array." In some implementations, a dynamic analog CAM array is used to store an analog representation of a sparse look-up table (LUT). The sparse LUT may be generated by any acceptable technique. For example, the sparse LUT may be based on a machine learning model (such as a decision tree model).

Figure 1:
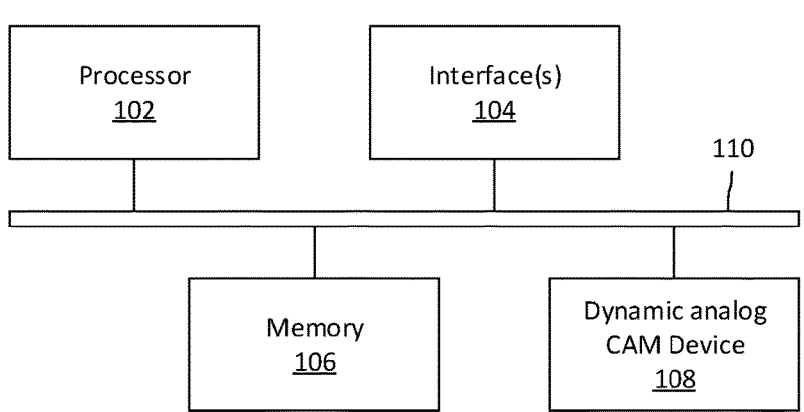
FIG. 1 is a block diagram of a computing system, according to some implementations.

FIG. 1 is a block diagram of a computing system 100, which may be used to process a decision tree model, according to some implementations. The computing system 100 may be implemented in an electronic device. Examples of electronic devices include network devices (e.g., routers, switches, access points, etc.), host devices (e.g., servers, personal computers, mobile devices, etc.), and the like.

The computing system 100 may be utilized in any data processing scenario, including stand-alone hardware, mobile applications, or combinations thereof. Further, the computing system 100 may be used in a computing network, such as a public cloud network, a private cloud network, a hybrid cloud network, other forms of networks, or combinations thereof. In one example, the methods provided by the computing system 100 are provided as a service over a network by, for example, a third party. The computing system 100 may be implemented on one or more hardware platforms, in which the modules in the system may be executed on one or more platforms. Such modules may run on various forms of cloud technologies and hybrid cloud technologies or be offered as a Software-as-a-Service that may be implemented on or off a cloud network.

To achieve its desired functionality, the computing system 100 includes various hardware components. These hardware components may include a processor 102, one or more interface(s) 104, a memory 106, and a dynamic analog CAM device 108. The hardware components may be interconnected through a number of busses and/or network connections. In one example, the processor 102, the interface(s) 104, the memory 106, and the dynamic analog CAM device 108 may be communicatively coupled via a bus 110, such as a PCI-Express bus.

The processor 102 retrieves executable code from the memory 106 and executes the executable code. The executable code may, when executed by the processor 102, cause the processor 102 to implement any functionality described herein. The processor 102 may be a microprocessor, an application-specific integrated circuit, a microcontroller, or the like.

The interface(s) 104 enable the processor 102 to interface with various other hardware components, external and internal to the computing system 100. For example, the interface(s) 104 may include interface(s) to input/output devices, such as, for example, a display device, a mouse, a keyboard, etc. Additionally or alternatively, the interface(s) 104 may include interface(s) to storage devices, network devices, host devices, or the like.

The memory 106 may include various types of memory, including volatile and nonvolatile memory. For example, the memory 106 may include Random-Access Memory (RAM), Read-Only Memory (ROM), a Hard Disk Drive (HDD), and/or the like. Different types of memory may be used for different data storage needs. For example, the processor 102 may boot from ROM, maintain nonvolatile storage in an HDD, execute program code stored in RAM, and store data under processing in RAM. The memory 106 may include a non-transitory computer readable medium that stores instructions for execution by the processor 102. One or more modules within the computing system 100 may be partially or wholly embodied as software and/or hardware for performing any functionality described herein.

The dynamic analog CAM device 108 is an accelerator for processing a machine learning model. For example, the dynamic analog CAM device 108 may be used by the processor 102 to accelerate processing of a decision tree model. The dynamic analog CAM device 108 is different than the processor 102. In some implementations, the dynamic analog CAM device 108 includes a dynamic analog CAM array. The dynamic analog CAM array may be programmed with values corresponding to a decision tree model, such as a sparse look-up table. Thus, a decision tree model may be stored in the dynamic analog CAM array. The dynamic analog CAM device 108 may be able to process the decision tree model more efficiently than a general-purpose processor (e.g., the processor 102). Accordingly, use of the dynamic analog CAM device 108 may improve the efficiency of the computing system 100.

Figure 2:
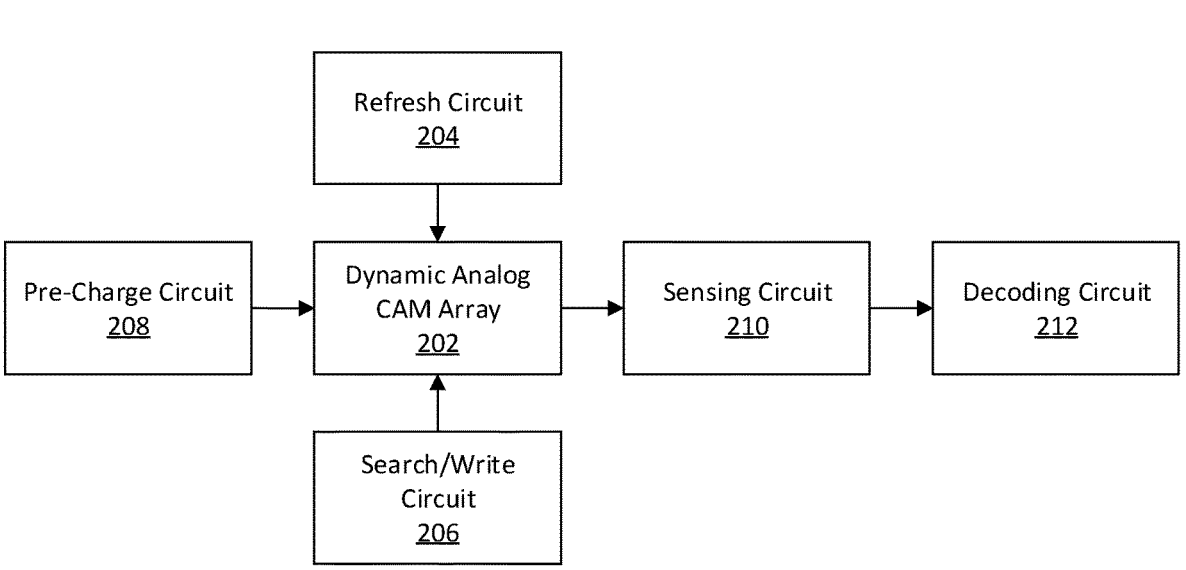
FIG. 2 is a block diagram of a dynamic analog CAM device, according to some implementations.

FIG. 2 is a block diagram of a dynamic analog CAM device 200, according to some implementations. The dynamic analog CAM device 200 is an example implementation of the dynamic analog CAM device 108 previously described for FIG. 1. The dynamic analog CAM device 200 includes a dynamic analog CAM array 202 as well as multiple peripheral circuits used for programming and operating the dynamic analog CAM array 202. For example, the peripheral circuit may include a refresh circuit 204, a search/write circuit 206, a pre-charge circuit 208, a sensing circuit 210, and a decoding circuit 212.

The dynamic analog CAM array 202 includes multiple dynamic analog CAM cells (subsequently described), which may be arranged in rows and columns. As previously alluded to, the dynamic analog CAM cells search multi-level voltages and store analog values in dynamic memory. A range may be programmed for each dynamic analog CAM cell of the dynamic analog CAM array 202. The dynamic analog CAM array 202 may be programmed to store a machine learning model.

During a search operation, a search word of analog input values is input to the dynamic analog CAM array 202 over search lines. One or more dynamic analog CAM cells in the dynamic analog CAM array 202 (e.g., a row of dynamic analog CAM cells, also referred to as a "dynamic analog CAM row") then indicates whether the analog input values are matched by their stored ranges. The stored range encoded in a dynamic analog CAM cell is compared against a respective analog input value of the search word. During a write operation, a stored word of analog input values is communicated to one or more dynamic analog CAM cells of the dynamic analog CAM array 202. The stored range in a dynamic analog CAM cell is encoded based on a respective analog input value of the stored word.

The refresh circuit 204 is connected to the dynamic analog CAM array 202. The dynamic analog CAM cells of the dynamic analog CAM array 202, being dynamic in nature, must be periodically refreshed (in a similar manner as dynamic RAM). The refresh circuit 204 may include any acceptable circuit that is configured to periodically refresh the dynamic analog CAM cells.

The search/write circuit 206 performs a search operation or a write operation for the dynamic analog CAM array 202. The search/write circuit 206 may include a digital to analog converter (DAC), drivers, and the like. The DAC is used to apply write voltages to dynamic analog CAM cells of the dynamic analog CAM array 202 during a write operation, and to apply search voltages to dynamic analog CAM cells of the dynamic analog CAM array 202 during a search operation. The search/write operations may involve setting appropriate analog voltage levels to represent desired analog input values. For example, the DAC may apply write voltages to program the stored ranges for dynamic analog CAM cells of the dynamic analog CAM array 202, or may apply search voltages to test whether the search voltages are within the ranges programmed in dynamic analog CAM cells of the dynamic analog CAM array 202. Specifically, the search/write circuit 206 may apply voltages to search lines and word lines (subsequently described) of the dynamic analog CAM array 202, such as via appropriate drivers.

The pre-charge circuit 208 pre-charges a match line for one or more CAM cells (e.g., a dynamic analog CAM row) of the dynamic analog CAM array 202 to a voltage $V_{ml}$ before a search operation begins. During a search operation, the match line of the dynamic analog CAM cells remains high (e.g., remains at the voltage $V_{ml}$) to indicate a match if the analog input values applied to the dynamic analog CAM cells are matched by the ranges stored in the respective dynamic analog CAM cells. Alternatively, the match line goes low (e.g., the voltage $V_{ml}$ drops) as a current in the match line discharges through pull-down transistors of a dynamic analog CAM cell to indicate a mismatch if analog input values applied to the dynamic analog CAM cells are not matched by the ranges stored in the dynamic analog CAM cells.

The sensing circuit 210 senses the outputs of the dynamic analog CAM cells of the dynamic analog CAM array 202. The sensing circuit 210 may include a sense amplifier for each dynamic analog CAM row. The match line of each dynamic analog CAM row is connected to a sense amplifier. The sense amplifier may be used during a search operation to detect if a match line of a dynamic analog CAM row is high (indicating a match with a search word) or low (indicating a mismatch with the search word).

The decoding circuit 212 is connected to the sensing circuit 210. As previously alluded to, each match line of the dynamic analog CAM array 202 is either high (indicating a match with a search word) or low (indicating a mismatch with the search word), and the state of each match line is determined by the sensing circuit 210. The decoding circuit 212 may include a programmable memory device for each dynamic analog CAM row of the dynamic analog CAM array 202. During a search operation, the decoding circuit 212 detects the combination of high and low match lines of the dynamic analog CAM array 202 (as sensed by the sensing circuit 210), and converts that combination to a value. For example, when the dynamic analog CAM array 202 stores a decision tree model, such as a sparse look-up table, the decoding circuit 212 outputs a decision value that corresponds to the combination of high and low match lines. During a write operation, the decoding circuit 212 may be programmed along with the dynamic analog CAM array 202.

The dynamic analog CAM device 200 may also include a controller (not separately illustrated) for controlling the components of the dynamic analog CAM device 200. For example, the controller may control the sensing circuit 210, the search/write circuit 206, and the refresh circuit 204. The controller may include a digital control circuit such as a microcontroller, an application-specific integrated circuit, or the like. The digital control circuit provides necessary control signals and data to the sensing circuit 210 and the search/write circuit 206. For example, the digital control circuit may be used to drive the DAC of the search/write circuit 206, as well as control and coordinate the operation of the DAC. The controller may include other components, such a clock circuit for temporalizing operations in the dynamic analog CAM device 200.

FIG. 3 is a schematic of a dynamic analog CAM array 300, according to some implementations. The dynamic analog CAM array 300 is an example implementation of the dynamic analog CAM array 202 previously described for FIG. 2. The dynamic analog CAM array 300 includes multiple dynamic analog CAM cells 302, which may be arranged in dynamic analog CAM rows 304 and dynamic analog CAM columns 306. As subsequently described in greater detail, the dynamic analog CAM cells 302 are implemented using dynamic memory.

The dynamic analog CAM array 300 includes search lines SL arranged along the dynamic analog CAM columns 306 and match lines ML arranged along the dynamic analog CAM rows 304. The dynamic analog CAM array 300 is configured to receive a plurality of analog input values. The analog input values are provided on respective ones of the search lines SL. The analog input values may correspond to respective values of a feature vector. In the illustrated example, there are four analog input values f1, f2, f3, and f4. The quantity of dynamic analog CAM columns 306 may be equal to the quantity of analog input values (and search lines SL).

Each search line SL is connected to search line nodes of the dynamic analog CAM cells 302 along a dynamic analog CAM column 306. The analog input values are provided on the search lines SL. Each dynamic analog CAM column 306 receives, as input during a search operation, a respective analog input value of the analog input values on a respective search line SL. In the illustrated example, a first dynamic analog CAM column 306 receives the first analog input value f1, a second dynamic analog CAM column 306 receives the second analog input value f2, a third dynamic analog CAM column 306 receives the fourth analog input value f4, and a fourth dynamic analog CAM column 306 receives the fourth analog input value f4.

Each match line ML is connected to match line nodes of the dynamic analog CAM cells 302 along a dynamic analog CAM row 304. The match lines ML are pre-charged to a voltage $V_{ml}$ before a search operation begins. A match line ML remaining high during a search operation indicates that respective ones of the analog input values fall within the ranges stored within the respective dynamic analog CAM cells 302 along a dynamic analog CAM row 304. In the illustrated example, a match line ML1 of a dynamic analog CAM row 304 remaining high indicates that the first analog input value f1 is within the range stored in the first dynamic analog CAM cell 302A of a dynamic analog CAM row 304, the second analog input value f2 is within the range stored in the second dynamic analog CAM cell 302B of the dynamic analog CAM row 304, the third analog input value f3 is within the range stored in the third dynamic analog CAM cell 302C of the dynamic analog CAM row 304, and the fourth analog input value f4 is within the range stored in the fourth dynamic analog CAM cell 302D of the dynamic analog CAM row 304.

FIGS. 4A-4B show examples of a variance ranges that may be stored in dynamic analog CAM cells. As previously noted, a stored range refers to a range of voltages defined by an upper bound $V_{hi}$ and a lower bound $V_{lo}$, with the upper bound $V_{hi}$ being greater than the lower bound $V_{lo}$. The values corresponding to matches are shown with cross hatching.

In the example of FIG. 4A, the dynamic analog CAM cell tests whether a target value is inside of a stored range. The lower bound $V_{lo}$ and the upper bound $V_{hi}$ of the range are each between a minimum value (e.g., 0) and a maximum value (e.g., 1). As a result, the dynamic analog CAM cell may indicate a match if the target value is greater than the lower bound $V_{lo}$ and is less than upper bound $V_{hi}$ (in the analog domain). Such a dynamic analog CAM cell may be referred to as an "AND-type dynamic analog CAM cell." The dynamic analog CAM cell may be operated in other manners. For example, the lower bound $V_{lo}$ may be set to the minimum value, in which case the dynamic analog CAM cell may indicate a match if the target value is less than upper bound $V_{hi}$ (in the analog domain). Likewise, the upper bound $V_{hi}$ may be set to the maximum value, in which case the dynamic analog CAM cell may indicate a match if the target value is greater than lower bound $V_{lo}$ (in the analog domain). Furthermore, the lower bound $V_{lo}$ may be set to the minimum value and the upper bound $V_{hi}$ may be set to the maximum value, in which case the dynamic analog CAM cell may always indicate a match.

In the example of FIG. 4B, the dynamic analog CAM cell tests whether a target value is outside of a stored range. The lower bound $V_{lo}$ and the upper bound $V_{hi}$ of the range are each between a minimum value (e.g., 0) and a maximum value (e.g., 1). As a result, the dynamic analog CAM cell may indicate a match if the target value is less than the lower bound $V_{lo}$ or is greater than upper bound $V_{hi}$ (in the analog domain). Such a dynamic analog CAM cell may be referred to as an "OR-type dynamic analog CAM cell." The dynamic analog CAM cell may be operated in other manners. For example, the lower bound $V_{lo}$ may be set to the minimum value, in which case the dynamic analog CAM cell may indicate a match if the target value is greater than upper bound $V_{hi}$ (in the analog domain). Likewise, the upper bound $V_{hi}$ may be set to the maximum value, in which case the dynamic analog CAM cell may indicate a match if the target value is less than lower bound $V_{lo}$ (in the analog domain). Furthermore, the lower bound $V_{lo}$ may be set to the maximum value and the upper bound $V_{hi}$ may be set to the minimum value, in which case the dynamic analog CAM cell may always indicate a match.

As subsequently described in greater detail, the lower bound and the upper bound of a range will be stored in a dynamic analog CAM cell using dynamic memory. Specifically, the dynamic analog CAM cell includes a first dynamic memory circuit that includes a first capacitor, and a second dynamic memory circuit that includes a second capacitor. The lower bound of the range is encoded by a stored charge of the first capacitor, while the upper bound of the range is encoded by a stored charge of the second capacitor.

Figure 5:
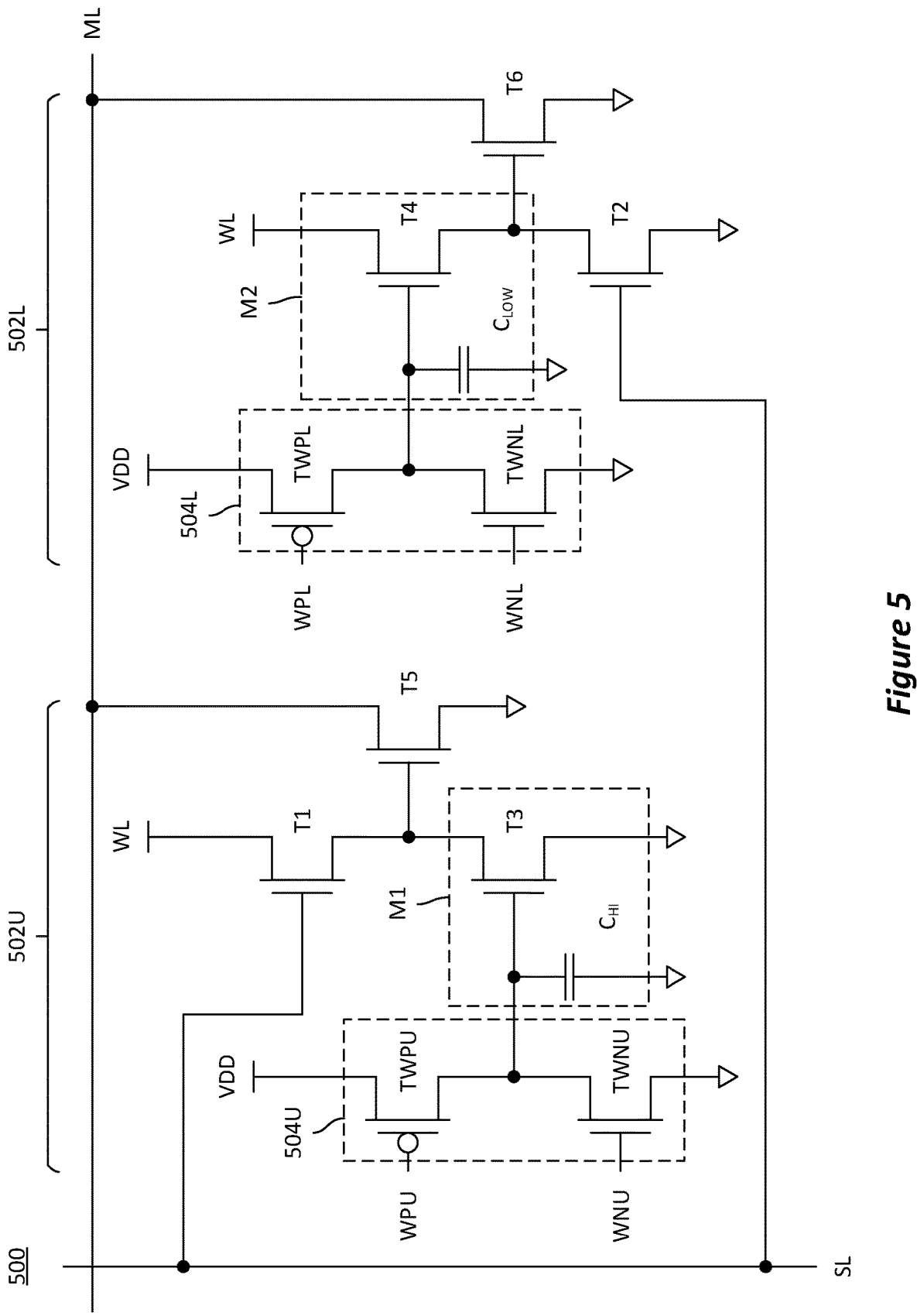
FIG. 5 shows an example of a dynamic analog CAM cell, according to some implementations.

FIG. 5 shows an example of a dynamic analog CAM cell 500, according to some implementations The dynamic analog CAM cell 500 is an example implementation of the dynamic analog CAM cell 302 previously described for FIG. 3. The dynamic analog CAM cell 500 is an AND-type dynamic analog CAM cell that stores a range and may be used to test whether an analog input value is inside of the stored range.

The dynamic analog CAM cell 500 includes a match line node that is connected to a match line ML, a word line node that is connected to a word line WL, and a search line node that is connected to a search line SL. As previously noted, the match line ML is along a dynamic analog CAM row, while the search line SL is along a dynamic analog CAM column. The word line WL is also along a dynamic analog CAM row. The match line ML is connected to and may be charged by a pre-charge circuit (previously described for FIG. 2). Additionally, the match line ML is connected to and may be read by a sensing circuit (previously described for FIG. 2). The search line SL and the word line WL are connected to and may be controlled by a search/write circuit (previously described for FIG. 2).

The dynamic analog CAM cell 500 includes two bound circuits 502 (including an upper bound circuit 502U and a lower bound circuit 502L). Each bound circuit 502 stores a bound of a range by encoding the bound. In some implementations, each bound circuit 502 includes a pull-down transistor, a plurality of current generator transistors, and a capacitor for encoding the bound. Additionally, each bound circuit 502 compares its stored bound to an analog input value on the source line SL. Specifically, the upper bound circuit 502U stores the upper bound of the range, and compares the upper bound to an analog input value on the source line SL when the word line WL is raised (or activated). Likewise, the lower bound circuit 502L stores the lower bound of the range, and compares the lower bound to the analog input value on the source line SL when the word line WL is raised.

The upper bound circuit 502U includes a dynamic memory circuit M1 and a control transistor T1. The control transistor T1 may be an n-type transistor (e.g., an N-type MOSFET). The dynamic memory circuit M1 is connected in series with the control transistor T1 between the word line WL and a reference node (for ground). The dynamic memory circuit M1 and the control transistor T1 are a first memory-transistor pair M1/T1. The output of the first memory-transistor pair M1/T1 is connected to a gate of a pull-down transistor T5. The pull-down transistor T5 may be an n-type transistor (e.g., an n-type MOSFET). The pull-down transistor T5 is connected between the match line node (for the match line ML) and the reference node (for ground). Thus, the match line ML may be pulled to ground if the pull-down transistor T5 is activated (or turned on).

The first memory-transistor pair M1/T1 form a current generator, which is controlled by the search line SL. The output of the controlled current generator drives the gate of the pull-down transistor T5. Specifically, the output of the controlled current generator is small when the analog input value on the search line SL is small (thus causing the control transistor T1 to have a small conductance) while the output of the controlled current generator is large when the analog input value on the search line SL is large (thus causing the control transistor T1 to have a large conductance). When the output of the controlled current generator is large, the gate of the pull-down transistor T5 is activated such that the match line ML is discharged to ground. As used herein, the gate of the pull-down transistor T5 being activated refers to the conductance of the pull-down transistor T5 being large enough to discharge the match line ML to ground. Likewise, when the output of the controlled current generator is small, the gate of the pull-down transistor T5 is deactivated such that the match line ML is not discharged to ground. As used herein, the gate of the pull-down transistor T5 being deactivated refers to the conductance of the pull-down transistor T5 being small enough to not discharge the match line ML to ground.

The dynamic memory circuit M1 is configured to store an upper bound of a range. The dynamic memory circuit M1 includes any suitable memory for storing the upper bound of the range. In the example implementation, the dynamic memory circuit M1 includes a weight capacitor $C_{HI}$ and a readout transistor T3. The readout transistor T3 may be an n-type transistor (e.g., an n-type MOSFET). The weight capacitor $C_{HI}$ is connected between the reference node (for ground) and the gate of the readout transistor T3. The weight capacitor $C_{HI}$ is used as an analog weight, and drives the readout transistor T3. The stored charge of the weight capacitor $C_{HI}$ determines the voltage applied to the gate of the readout transistor T3, and thus determines the conductance of the readout transistor T3. Accordingly, the upper bound of the range may be encoded by the stored charge of the weight capacitor $C_{HI}$.

The control transistor T1 and the readout transistor T3 form a voltage divider, the output of which is connected to the gate of the pull-down transistor T5. That is, the gate of the pull-down transistor T5 is connected to a source/drain region of the control transistor T1 and to a source/drain region of the readout transistor T3. The control transistor T1 is connected between the word line WL and the readout transistor T3. The readout transistor T3 is connected between the control transistor T1 and the reference node (for ground).

During a search operation, a voltage is applied to the search line SL to provide the analog input value for comparison (in the analog domain) with the upper bound of the range stored in the dynamic memory circuit M1. The search line SL is electrically connected to a gate of the control transistor T1. The analog input value applied to the gate of the control transistor T1 (via the search line SL) determines the conductance of the control transistor T1. Because the control transistor T1 and the readout transistor T3 are part of a voltage divider, the voltage supplied on the word line WL is distributed among the control transistor T1 and the readout transistor T3 based on their conductances. When the voltage on the search line SL is sufficiently smaller than the voltage stored on the weight capacitor $C_{HI}$, then the output of the voltage divider will be small enough to deactivate the gate of the pull-down transistor T5. Conversely, when the voltage on the search line SL is sufficiently larger than the voltage stored on the weight capacitor $C_{HI}$, then the output of the voltage divider will be large enough to activate the gate of the pull-down transistor T5. In other words, the pull-down transistor T5 is activated when the conductance of the control transistor T1 is sufficiently larger than the conductance of the readout transistor T3.

During a write operation, a programming voltage is applied to the dynamic memory circuit M1. In the example implementation where the dynamic memory circuit M1 includes a weight capacitor $C_{HI}$, the programming voltage is applied to the weight capacitor $C_{HI}$, thereby charging or discharging the weight capacitor $C_{HI}$ until the weight capacitor $C_{HI}$ holds the programmed voltage. The upper bound circuit 502U may further include a charging circuit 504U connected to the memory circuit M1, e.g., to the weight capacitor $C_{HI}$.

The charging circuit 504U includes any suitable circuit for programming the memory circuit M1. Programming the memory circuit M1 may include applying a voltage to the weight capacitor $C_{HI}$. In the example implementation, the charging circuit 504U includes a high-charging transistor TWPU and a low-charging transistor TWNU, each of which are connected to the weight capacitor $C_{HI}$. The high-charging transistor TWPU may be a p-type transistor (e.g., a p-type MOSFET), and the low-charging transistor TWNU may be an n-type transistor (e.g., an n-type MOSFET). The gate of the high-charging transistor TWPU is connected to a high-charging line WPU, while the gate of the low-charging transistor TWNU is connected to a low-charging line WNU. The high-charging line WPU and the low-charging line WNU may be controlled by a search/write circuit (previously described for FIG. 2).

The stored charge of the weight capacitor $C_{HI}$ may be increased by activating the high-charging transistor TWPU (by activating the high-charging line WPU) and deactivating the low-charging transistor TWNU (by deactivating the low-charging line WNU). The stored charge of the weight capacitor $C_{HI}$ may be decreased by deactivating the high-charging transistor TWPU (by deactivating the high-charging line WPU) and activating the low-charging transistor TWNU (by activating the low-charging line WNU). Activating a charging line may include raising it to the supply voltage VDD. Deactivating a charging line may include lowering it to ground. The duration that a charge line is activated may be larger when the desired stored charge of the weight capacitor $C_{HI}$ is larger.

The lower bound circuit 502L includes a dynamic memory circuit M2 and a control transistor T2. The control transistor T2 may be an n-type transistor (e.g., an n-type MOSFET). The dynamic memory circuit M2 is connected in series with the control transistor T2 between the word line WL and a reference node (for ground). The dynamic memory circuit M2 and the control transistor T2 are a second memory-transistor pair M2/T2. The output of the second memory-transistor pair M2/T2 is connected to a gate of a pull-down transistor T6. The pull-down transistor T6 may be an n-type transistor (e.g., an n-type MOSFET). The pull-down transistor T6 is connected between the match line node (for the match line ML) and the reference node (for ground). Thus, the match line ML may be pulled to ground if the pull-down transistor T6 is activated (or turned on). In this implementation, the pull-down transistors T5-T6 are connected in parallel between the match line node (for the match line ML) and the reference node (for ground).

The second memory-transistor pair M2/T2 form a current generator, which is controlled by the search line SL. The output of the controlled current generator drives the gate of the pull-down transistor T6. Specifically, the output of the controlled current generator is large when the analog input value on the search line SL is small (thus causing the control transistor T2 to have a small conductance) while the output of the controlled current generator is small when the analog input value on the search line SL is large (thus causing the control transistor T2 to have a large conductance). When the output of the controlled current generator is large, the gate of the pull-down transistor T6 is activated such that the match line ML is discharged to ground. As used herein, the gate of the pull-down transistor T6 being activated refers to the conductance of the pull-down transistor T6 being large enough to discharge the match line ML to ground. Likewise, when the output of the controlled current generator is small, the gate of the pull-down transistor T6 is deactivated such that the match line ML is not discharged to ground. As used herein, the gate of the pull-down transistor T6 being deactivated refers to the conductance of the pull-down transistor T6 being small enough to not discharge the match line ML to ground.

The dynamic memory circuit M2 is configured to store a lower bound of a range. The dynamic memory circuit M2 includes any suitable memory for storing the lower bound of the range. In the example implementation, the dynamic memory circuit M2 includes a weight capacitor $C_{LOW}$ and a readout transistor T4. The readout transistor T4 may be an n-type transistor (e.g., an n-type MOSFET). The weight capacitor $C_{LOW}$ is connected between the reference node (for ground) and the gate of the readout transistor T4. The weight capacitor $C_{LOW}$ is used as an analog weight, and drives the readout transistor T4. The capacitance of the weight capacitor $C_{LOW}$ may (or may not) be different than the capacitance of the weight capacitor $C_{HI}$. The stored charge of the weight capacitor $C_{LOW}$ determines the voltage applied to the gate of the readout transistor T4, and thus determines the conductance of the readout transistor T4. Accordingly, the lower bound of the range may be encoded by the stored charge of the weight capacitor $C_{LOW}$.

The control transistor T2 and the readout transistor T4 form a voltage divider, the output of which is connected to the gate of the pull-down transistor T6. That is, the gate of the pull-down transistor T6 is connected to a source/drain region of the control transistor T2 and to a source/drain region of the readout transistor T4. The readout transistor T4 is connected between the word line WL and the control transistor T2. The control transistor T2 is connected between the readout transistor T4 and the reference node (for ground).

During a search operation, a voltage is applied to the search line SL to provide the analog input value for comparison (in the analog domain) with the lower bound of the range stored in the dynamic memory circuit M2. The search line SL is electrically connected to a gate of the control transistor T2. The analog input value applied to the gate of the control transistor T2 (via the search line SL) determines the conductance of the control transistor T2. Because the control transistor T2 and the readout transistor T4 are part of a voltage divider, the voltage supplied on the word line WL is distributed among the control transistor T2 and the readout transistor T4 based on their conductances. When the voltage on the search line SL is sufficiently larger than the voltage stored on the weight capacitor $C_{LOW}$, then the output of the voltage divider will be small enough to deactivate the gate of the pull-down transistor T6. Conversely, when the voltage on the search line SL is sufficiently smaller than the voltage stored on the weight capacitor $C_{LOW}$, then the output of the voltage divider will be large enough to activate the gate of the pull-down transistor T6. In other words, the pull-down transistor T6 is activated when the conductance of the readout transistor T4 is sufficiently larger than the conductance of the control transistor T2.

During a write operation, a programming voltage is applied to the dynamic memory circuit M2. In the example implementation where the dynamic memory circuit M2 includes a weight capacitor $C_{LOW}$, the programming voltage is applied to the weight capacitor $C_{LOW}$, thereby charging or discharging the weight capacitor $C_{LOW}$ until the weight capacitor $C_{LOW}$ holds the programmed voltage. The lower bound circuit 502L may further include a charging circuit 504L connected to the memory circuit M2, e.g., to the weight capacitor $C_{LOW}$.

The charging circuit 504L includes any suitable circuit for programming the memory circuit M2. Programming the memory circuit M2 may include applying a voltage to the weight capacitor $C_{LOW}$. In the example implementation, the charging circuit 504L includes a high-charging transistor TWPL and a low-charging transistor TWNL, each of which are connected to the weight capacitor $C_{LOW}$. The high-charging transistor TWPL may be a p-type transistor (e.g., a p-type MOSFET), and the low-charging transistor TWNL may be an n-type transistor (e.g., an n-type MOSFET). The gate of the high-charging transistor TWPL is connected to a high-charging line WPL, while the gate of the low-charging transistor TWNL is connected to a low-charging line WNL. The high-charging line WPL and the low-charging line WNL may be controlled by the search/write circuit (previously described for FIG. 2).

The stored charge of the weight capacitor $C_{LOW}$ may be increased by activating the high-charging transistor TWPL (by activating the high-charging line WPL) and deactivating the low-charging transistor TWNL (by deactivating the low-charging line WNL). The stored charge of the weight capacitor $C_{LOW}$ may be decreased by deactivating the high-charging transistor TWPL (by deactivating the high-charging line WPL) and activating the low-charging transistor TWNL (by activating the low-charging line WNL). Activating a charging line may include raising it to the supply voltage VDD. Deactivating a charging line may include lowering it to ground. The duration that a charge line is activated may be larger when the desired stored charge of the weight capacitor $C_{LOW}$ is larger.

Whether a match is found between the analog input value (received via the search line SL) and the range (stored in the dynamic memory circuits M1-M2) is indicated over the match line ML. The match line ML is pre-charged to a voltage $V_{ml}$ before a search operation begins. As the search operation is performed, the match line ML remains high (e.g., remains at the voltage $V_{ml}$) to indicate a match if the analog input value applied to the dynamic analog CAM cell 500 via the search line SL is matched by the stored range that is encoded in the dynamic memory circuits M1-M2. Alternatively, if analog input value applied to the dynamic analog CAM cell 500 via the search line SL is not matched by the stored range that is encoded in the dynamic memory circuits M1-M2, the match line ML goes low (e.g., the voltage $V_{ml}$ drops) to indicate a mismatch. The voltage $V_{ml}$ drops because a current in the match line ML discharges through one of the pull-down transistors T5-T6 to ground. For example, when the analog input value applied to the dynamic analog CAM cell 500 via the search line SL is greater than the upper bound of the range that is encoded by a stored charge of the first dynamic memory circuit M1, the voltage $V_{ml}$ drops as the current in the match line ML discharges through the pull-down transistor T5. Likewise, when the analog input value applied to the dynamic analog CAM cell 500 via the search line SL is less than the lower bound of the range that is encoded by a stored charge of the second dynamic memory circuit M2, the voltage $V_{ml}$ drops as the current in the match line ML discharges through the pull-down transistor T6.

Figure 6:
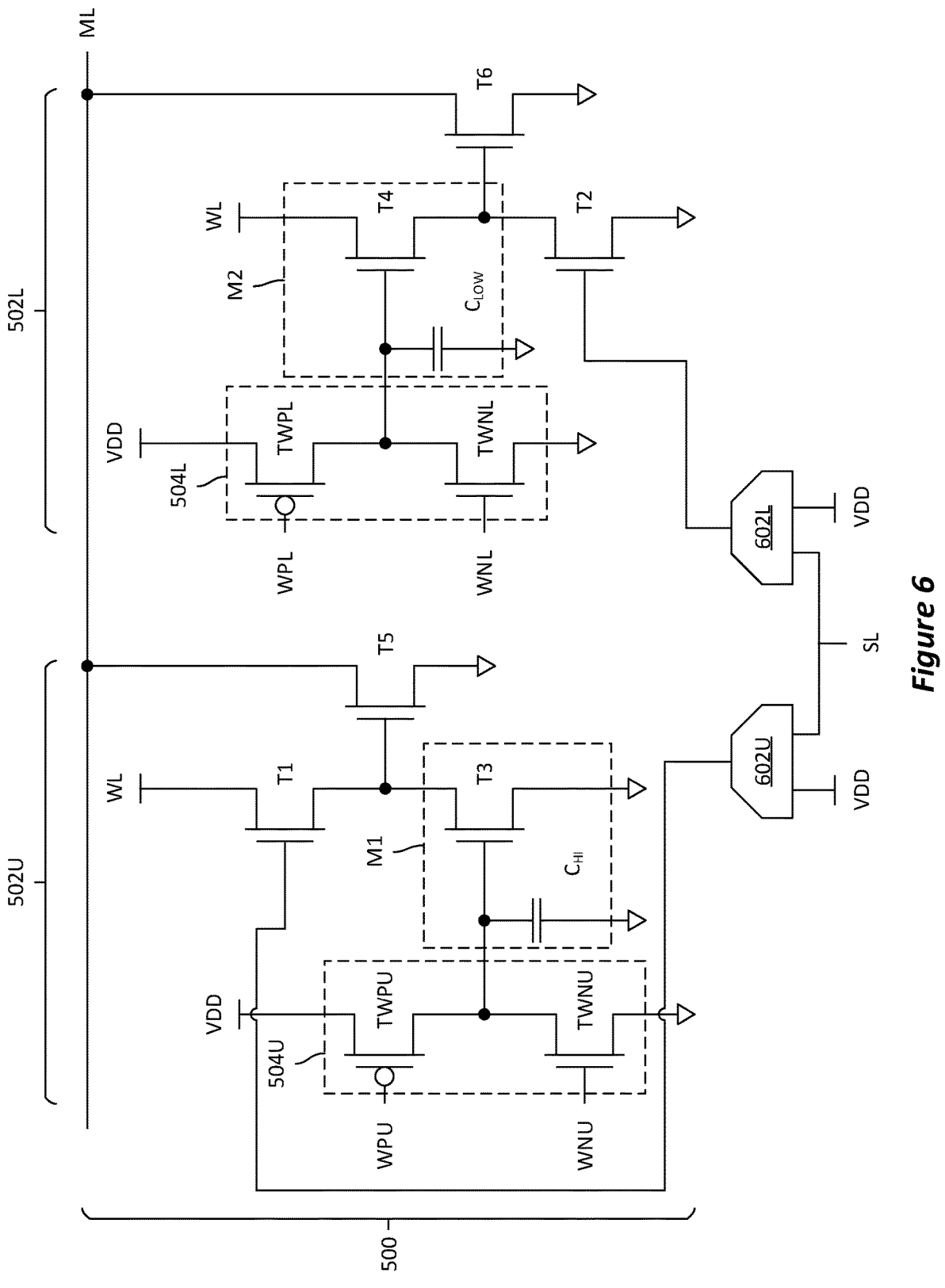
FIG. 6 shows an example of a circuit configuration for a dynamic analog CAM cell, according to some implementations.

FIG. 6 shows an example of a circuit configuration for a dynamic analog CAM cell 500, according to some implementations. In this implementation, the search line SL is connected to a first multiplexer 602L and a second multiplexer 602U. The first multiplexer 602L may be used to switch between connecting one of the search line SL and the supply voltage VDD to the gate of the control transistor T1. The second multiplexer 602U may be used to switch between connecting one of the search line SL and the supply voltage VDD to the gate of the control transistor T2. The first multiplexer 602L and the second multiplexer 602U may be part of a search/write circuit (previously described for FIG. 2), to which the dynamic analog CAM cell 500 is connected.

Before a search operation, the supply voltage VDD is selected by the first multiplexer 602L and the second multiplexer 602U. Thus, the gates of the control transistors T1-T2 are driven by the supply voltage VDD. Once the search operation has begun, the search line SL is selected by the first multiplexer 602L and the second multiplexer 602U. Thus, the gates of the control transistors T1-T2 are driven by the search line SL. Driving the control transistors T1-T2 with the supply voltage VDD between search operations deactivates the pull-down transistors T5-T6, which may reduce the risk of erroneously discharging the match line ML during transitions.

Figure 7:
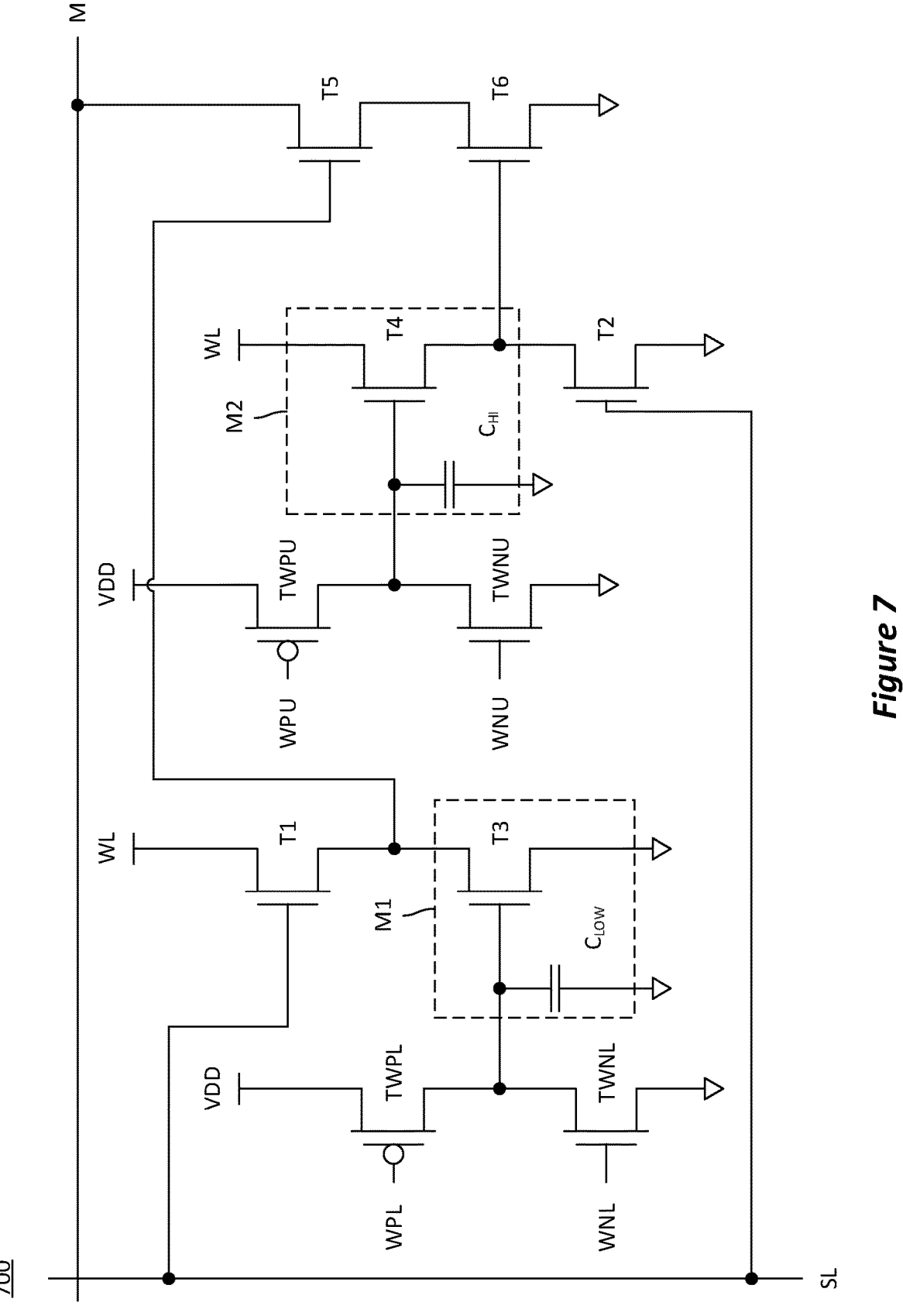
FIG. 7 shows an example of a dynamic analog CAM cell, according to some implementations.

FIG. 7 shows an example of a dynamic analog CAM cell 700, according to some implementations The dynamic analog CAM cell 700 is an example implementation of the dynamic analog CAM cell 302 previously described for FIG. 3. The dynamic analog CAM cell 700 is an OR-type dynamic analog CAM cell that stores a range and may be used to test whether an analog input value is outside of the stored range.

Like the dynamic analog CAM cell of FIG. 5, the dynamic analog CAM cell 700 includes a first memory-transistor pair M1/T1 (which form a first current generator) and a second memory-transistor pair M2/T2 (which form a second current generator). In this implementation, the pull-down transistors T5-T6 are connected in series between the match line node (for the match line ML) and the reference node (for ground). Additionally, the dynamic memory circuit M1 is configured to store a lower bound of a range while the dynamic memory circuit M2 is configured to store an upper bound of the range.

Some variations are contemplated. In some implementations, a dynamic analog CAM cell may be a multi-segment dynamic analog CAM cell, which stores multiple ranges and indicates a match when a test value falls inside any of its stored ranges. For example, a multi-segment dynamic analog CAM cell that stores two ranges may include features of the cells of FIGS. 5 and 7. Specifically, the multi-segment dynamic analog CAM cell may include four current generators, which each include a dynamic memory storing a bound of a range. The gate of a first pull-down transistor is connected to the output of a first current generator, the gate of a second pull-down transistor is connected to the output of a second current generator, the gate of a third pull-down transistor is connected to the output of a third current generator, and the gate of a fourth pull-down transistor is connected to the output of a fourth current generator. The first and second pull-down transistors may be connected in series between the match line node (for the match line ML) and the reference node (for ground). The third and fourth pull-down transistors may be connected in parallel between the match line node (for the match line ML) and the reference node (for ground).

Figure 8:
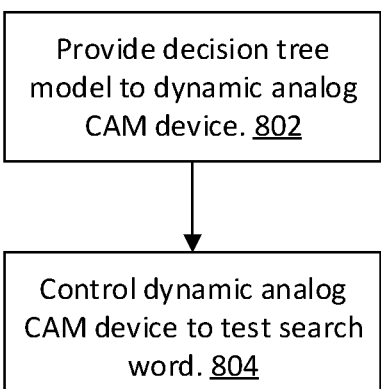
FIG. 8 is a diagram of a decision tree solving method, according to some implementations.

FIG. 8 is a diagram of a decision tree solving method 800, according to some implementations. The decision tree solving method 800 may be performed by a processor of a computing system (previously described for FIG. 1).

The processor performs a step 802 of providing a decision tree model to a dynamic analog CAM device. The decision tree model may be provided by providing values for the dynamic analog CAM device to program within its dynamic analog CAM cells (which may include AND-type dynamic analog CAM cells, OR-type dynamic analog CAM cells, multi-segment dynamic analog CAM cells, combinations thereof, or the like). The values may be provided to a search/write circuit of the dynamic analog CAM device. The values may be stored ranges, the bounds of which are programmed into the dynamic memory circuits of the dynamic analog CAM cells.

The processor performs a step 804 of controlling the dynamic analog CAM device to test a search word. The search word is provided to the dynamic analog CAM array of the device, using the search lines. The decoder of the dynamic analog CAM device may provide a decision value to the processor, which indicates what the resulting decision is for the search word.

The foregoing outlines features of several examples so that those skilled in the art may better understand the aspects of the present disclosure. Various modifications and combinations of the illustrative examples, as well as other examples, will be apparent to persons skilled in the art upon reference to the description. It is therefore intended that the appended claims encompass any such modifications.

What is claimed is:

1. A device comprising:
a first dynamic memory circuit;
a first control transistor, the first control transistor and the first dynamic memory circuit being connected in series between a word line and a reference node;
a first pull-down transistor connected between a match line and the reference node, a gate of the first pull-down transistor connected to the first control transistor and the first dynamic memory circuit;
a second dynamic memory circuit;
a second control transistor, the second control transistor and the second dynamic memory circuit being connected in series between the word line and the reference node; and
a second pull-down transistor connected between the match line and the reference node, a gate of the second pull-down transistor connected to the second control transistor and the second dynamic memory circuit.

2. The device of claim 1, wherein the first dynamic memory circuit comprises a first weight capacitor and a first readout transistor, and the second dynamic memory circuit comprises a second weight capacitor and a second readout transistor.

3. The device of claim 2, wherein the first readout transistor and the first control transistor are part of a first voltage divider, and the second readout transistor and the second control transistor are part of a second voltage divider.

4. The device of claim 2, wherein the first control transistor is connected between the word line and the first readout transistor, the first readout transistor is connected between the first control transistor and the reference node, the second readout transistor is connected between the word line and the second control transistor, and the second control transistor is connected between the second readout transistor and the reference node.

5. The device of claim 2, wherein the first weight capacitor is connected between the reference node and a gate of the first readout transistor, and the second weight capacitor is connected between the reference node and a gate of the second readout transistor.

6. The device of claim 1, wherein the first control transistor is an n-type transistor and the second control transistor is an n-type transistor.

7. The device of claim 1, wherein a gate of the first control transistor and a gate of the second control transistor are connected to a source line.

8. The device of claim 7, further comprising:
a sensing circuit connected to the match line; and
a search/write circuit connected to the source line.

9. The device of claim 1, further comprising:
a first charging circuit connected to the first dynamic memory circuit; and
a second charging circuit connected to the second dynamic memory circuit.

* * * * *